(12) United States Patent
Thallner

(10) Patent No.: US 6,485,568 B1
(45) Date of Patent: Nov. 26, 2002

(54) APPARATUS FOR COATING SUBSTRATES WITH MATERIALS, PARTICULARLY FOR LACQUERING SI-WAFERS

(76) Inventor: Erich Thallner, Bubing 132, A-4780 Schärding (AT)

( * ) Notice: Subject to any disclaimer, the term of this patent is extended or adjusted under 35 U.S.C. 154(b) by 0 days.

(21) Appl. No.: 09/551,775

(22) Filed: Apr. 18, 2000

(30) Foreign Application Priority Data

Apr. 22, 1999 (AT) ................................................ 711/99

(51) Int. Cl.⁷ .......................... B05C 5/00; B05C 15/00; B05B 15/06; B05B 1/26; B05D 5/12
(52) U.S. Cl. .................... 118/300; 118/64; 118/326; 239/11; 239/290; 239/300; 239/518; 239/543; 427/96; 427/421
(58) Field of Search ............................ 118/52, 56, 323, 118/64, 300, 313, 315, 320, 321, 317, 326; 427/96, 240, 421, 424, 180, 185; 239/11, 99, 101, 290, 292, 300, 461, 463, 464, 467, 518, 543, 297, 298

(56) References Cited

U.S. PATENT DOCUMENTS

| | | | |
|---|---|---|---|
| 3,999,188 A | * | 12/1976 | Yamada et al. |
| 4,064,295 A | * | 12/1977 | Singer ........................ 427/424 |
| 4,407,450 A | * | 10/1983 | Chegolya et al. |
| 4,510,176 A | | 4/1985 | Cuthbert et al. ............... 427/82 |
| 4,590,094 A | * | 5/1986 | Ringer, Jr. .................... 427/82 |
| 4,858,552 A | * | 8/1989 | Glatt et al. ..................... 118/19 |
| 5,605,103 A | * | 2/1997 | LaRue ........................ 110/262 |
| 5,658,387 A | * | 8/1997 | Reardon et al. ............. 118/323 |
| 5,685,908 A | * | 11/1997 | Brytsche et al. .............. 118/52 |
| 5,776,541 A | * | 7/1998 | Belt et al. .................... 427/186 |
| 6,296,043 B1 | * | 10/2001 | Bowen et al. ................ 164/46 |

FOREIGN PATENT DOCUMENTS

| EP | 0 540 447 | 5/1993 |
|---|---|---|
| JP | 9-29158 | 2/1997 |

* cited by examiner

Primary Examiner—Jerry A. Lorengo
(74) Attorney, Agent, or Firm—Collard & Roe, P.C.

(57) ABSTRACT

In an apparatus for coating substrates with materials, particularly for lacquering Si-wafers (9) with photosensitive material, comprising a treating chamber (1,16) holding a carrier (10) (chuck) for the substrate to be treated and at least one atomizing nozzle (2) generating a spray jet of the coating material, which may be dosed and which is directed towards the substrate, and a propellant gas, additional guiding and, respectively or, processing devices (6) are arranged between the atomizing nozzle or nozzles (2) and the substrate carrier (10) in the treating chamber (1, 16), which devices comprise nozzles or swirl generators charged with compressed gas or compressed gas and a solvent, and/or centrifugal disks, small turbines, or the like, and produce the spray jet directed towards the substrate from the spray mist generated by the atomizing nozzle or nozzles, for additionally influencing and controlling the spray jet and thereby to improve the quality of the material application.

5 Claims, 1 Drawing Sheet

APPARATUS FOR COATING SUBSTRATES WITH MATERIALS, PARTICULARLY FOR LACQUERING SI-WAFERS

FIELD OF THE INVENTION

The invention relates to an apparatus for coating substrates with materials, particularly for lacquering Si-wafers with photosensitive material, comprising a treating chamber holding a carrier (chuck) for the substrate to be treated and at least one atomizing nozzle generating a spray jet of the coating material, which may be dosed and which is directed towards the substrate, and a propellant gas. The invention also relates to modifications of the apparatus for handling materials in the microelectronic and microsystem fields, particularly also apparatus for treating exposed wafers with a developing or etching solution.

DESCRIPTION OF THE PRIOR ART

Known lacquering devices of this type do not make a sufficiently uniform lacquering possible and, therefore, they are used more often in the printed board technique than for lacquering Si-wafers with photosensitive material.

For the last-mentioned purposes, an amount of photosensitive resist, which is accurately dosed by a pump, is applied to the center of the wafer in other known devices, and the wafer is then rapidly rotated, causing excess resist to be thrown off and a relatively high uniformity on flat wafers to be achieved. This procedure is presently used most often for the indicated purposes. In another method, a photosensitive coating is applied to the substrate in the form of a film. Sometimes, closed lacquering chambers or co-rotating covers for the wafer are used to obtain a high quality and as uniform a coating thickness as possible on flat wafers.

At this time, no fully satisfactory installations are known for applying lacquer coatings to more strongly textured wafers or substrates required for the manufacture of micromechanical structures, for example barometers or other structures for inserting glass fibers, conductive elements, liquids, and so forth, and in which channels or troughs are also to be coated as uniformly as possible with photosensitive resist.

SUMMARY OF THE INVENTION

It is, therefore, the object of the invention to provide an apparatus of the first-mentioned type, which assures in its use as a lacquering apparatus for Si-wafers a lacquering of flat as well as textured wafers, which meets all requirements with respect to coating thickness, uniformity, surface structure and other texture, while allowing for an adaptation to the property of the lacquer used. Another object of the invention is the provision of an apparatus useful for applying other materials to a substrate, for example applying etching solutions to exposed wafers.

This object is obtained in accordance with the invention in principle by arranging additional guiding and, respectively or, processing devices between the atomizing nozzle or nozzles and the substrate carrier, which devices comprise nozzles or swirl generators charged with compressed gas or compressed gas and a solvent, and, respectively or, centrifugal disks, small turbines, or the like, and produce the spray jet directed towards the substrate by from the spray mist generated by the atomizing nozzle or nozzles.

The basic idea of the invention consists essentially in enabling a substantially more favorable and effective preparation of the coating material to be obtained when only a spray mist is first produced by the atomizing nozzles and the spray jet directed towards the substrate is generated from this spray mist by further devices. The degree of atomization of lacquer and solvent as well as the proportion of their amounts and mixture may be accurately adjusted in this lacquering process, this adjustment being possible even during the lacquering. This also applies to the propellant gas, it being even possible, if needed. to work with different temperatures of the materials generating the spray jet. Conventional propellant gases, which are transformed from a liquid to a gaseous phase upon decompression, may be used as propellant gas. Particularly preferred, however, is the use of air or inert gases, such as nitrogen.

A desired, substantially uniform distribution of the material on the substrate is aided by arranging the guiding, respectively processing devices adjustable with respect to the substrate carrier relative to distance and the direction of the spray jet towards the substrate. The distance also influences the impact velocity of the atomized material on the substrate.

Structurally, an embodiment is presently preferred in which the treating chamber has the basic form of an erect prism, particularly a hollow cylinder, the atomizing nozzle or nozzles being arranged close to the bottom and the guiding, respectively processing devices being spaced thereabove, the substrate carrier sitting on a removable cover of the treating chamber or itself forming the cover. The arrangement of the substrate carrier on the cover or as cover facilitates charging of the treating chamber and also makes it possible to transfer the substrate after coating, particularly lacquering, to a dripping station or a drying station. The described structure also has the indicated advantages in the treatment of other substrates with etching solutions, etc. If the cover corresponds to the size of the substrate carrier and its size corresponds substantially to that of the substrate, a treating chamber of relatively small volume results, in whose lower portion the atomizing nozzle or nozzles produce(s) a mist of the material, out of which the guiding, respectively processing devices generate the spray jet. Photosensitive resists produce in the lower portion of the treating chamber a relatively larger proportion of larger droplets generated by the atomizing nozzles than in the upper portion. By varying the adjustment of the guiding or processing devices, that is the depth to which they are immersed in the fog, the desired droplet size may be selected, these droplets normally being further sub-divided and accelerated by the processing devices.

The possibilities for adjustment are further enhanced if the treating chamber is comprised of an upper portion, a lower portion and the cover encompassing the substrate carrier, the lower portion holding the atomizing nozzle or nozzles consisting of the bottom and a portion of the side wall, and being arranged telescopically in the longitudinal direction relative to the upper portion, and the guiding, respectively processing devices being adjustably held in the upper portion. The chamber volume as well as the distances between atomizing nozzles and guiding, respectively processing devices and substrate carrier may each be independently adjusted. An outlet for material deposited on the bottom or its wall may be provided in the area of the bottom of the treating chamber.

Depending on the treatment involved, the manner in which the substrate is scanned by the spray jet may be variously adjusted. In the simplest case, only the guiding, respectively processing devices are adjusted relative to the substrate or the substrate is moved by the substrate carrier relative to the spray jet. Both manners of movement are possible. An additional improvement of the distribution of the material on the substrate may be obtained if the substrate carrier, as is known, is rotatable and/or is coupled to a vibrator. The rotational drive also enables excess material to be removed. Advantageously, such a centrifugal removal of material is used only when the substrate is essentially flat since a frequently undesired, non-uniform distribution of the coating over the structures may result in more strongly textured substrates. In this case, a vibration of the substrate carrier will produce the desired uniform application of the material.

According to a further embodiment, the treating chamber may be divided by a separating wall between the guiding or processing devices and the substrate carrier. This embodiment has the considerable advantage that the material mist is maintained in the lower portion of the treating chamber closed by the separating wall, and only the usually very small-volume upper portion of the treating chamber must be opened when the substrate is exchanged. Excess applied material may be stripped or thrown off only after the separating wall is closed so that any resultant droplets do not interfere with the operation. After the separating wall is opened, the desired chamber atmosphere making the formation of a spray jet possible may be established in a very short time when a new substrate is inserted.

Additional outlet and suction devices may be provided for the closed part of the treating chamber between the substrate carrier and the separating wall.

BRIEF DESCRIPTION OF THE DRAWING

Further details and advantages of the subject matter of the invention are found in the following description of the sole FIGURE. In the FIGURE, an apparatus for lacquering Si-wafers with a photosensitive resist is shown as an exemplary embodiment in a highly schematic section of the treating chamber.

DESCRIPTION OF THE PREFERRED EMBODIMENT

Figure 1:
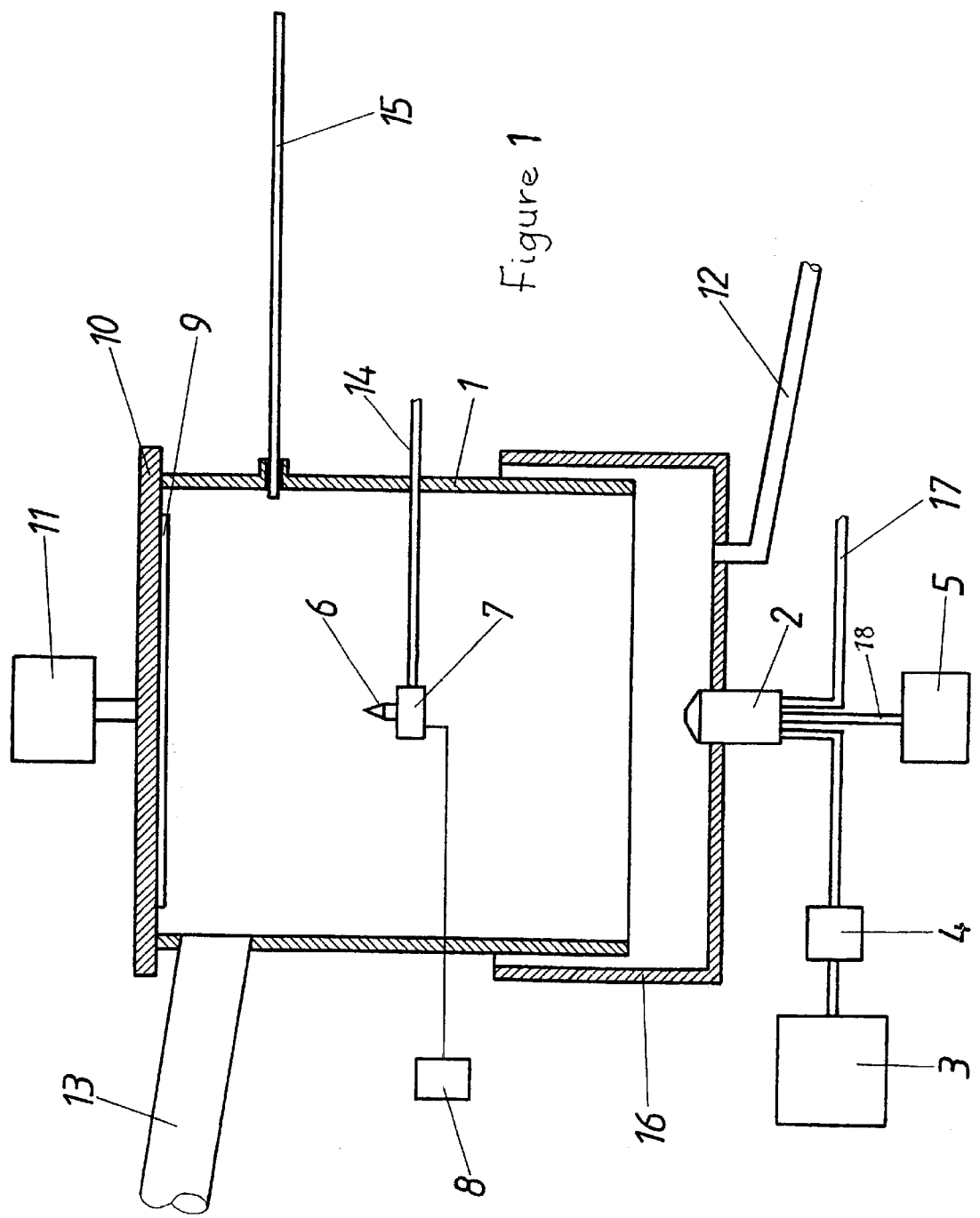

The apparatus has a substantially hollow cylindrical treating chamber comprising a tubular upper portion 1 and a lower portion 16 formed by a bottom and a side wall, which may be telescopingly drawn out of upper portion 1. In the exemplary embodiment, at least one atomizing nozzle 2 is mounted in the bottom, to which a photosensitive resist may be supplied from receptacle 3 by pump 4 and to which a line 18 may also supply a solvent from storage container 5 as well as a propellant gas, i.e. $N_2$, by another line 17. Atomizing nozzle 2 may be a compressed gas atomizing nozzle or a piezo-operated atomizing nozzle. In operation, it produces a spray mist of the supplied material, a change of the pressure and of the composition making it possible to adjust the average droplet size. Before start of the operation, the entire treating chamber is preferably filled with an inert gas, i.e. $N_2$.

A guiding and processing device shown as nozzle 6 is provided in the exemplary embodiment in upper portion 1 of the treating chamber, and this is vertically, laterally and obliquely adjustable by a motion unit 7 and takes up material from the surrounding spray mist and processes it into a directed spray jet. Motion unit 7 may be controlled by a control unit 8. The generated spray jet is directed towards substrate 9, particularly an Si-wafer, which is held, for instance by a vacuum, on substrate carrier 10 which simultaneously serves as a cover for the treating chamber and which mat be rotated, if desired, by drive unit 11. As may be desired, a uniform or an aimed non-uniform lacquering of substrate 9 may be produced by the various adjustment possibilities. Discharge outlet 12 is connected to lower portion 16 for excess material. Furthermore, there is a line 13 for a suction device. Line 14 is connected to nozzle 6 for supplying thereto a propellant gas ($N_2$) and optionally a solvent, which is sprayed or evaporated by nozzle 6. When the chamber is closed, the interior atmosphere is heavily saturated with solvent so that a drying of the lacquer mist is prevented.

The chamber may be divided by a separating wall 15 which may be inserted between nozzle 6 and substrate carrier 10 so that the entire lower portion is not influenced by an opening of the cover forming the substrate carrier and the upper portion may be evacuated beforehand through line 13. When the separating wall is closed, any excess lacquer may be thrown off by rotating substrate carrier 10 without causing turbulence in the atmosphere of the main space of the treating chamber. Nozzle 6 may be a simple accelerating nozzle but it may also be a Venturi nozzle which may according to one embodiment comprise a jacket receiving a propellant gas so that the spray jet emerging from the nozzle is more favorably stabilized by the surrounding propellant gas. Nozzle 6 may also contain a swirl generator. According to another embodiment, the nozzle is combined with a swirl generator, or instead of the nozzle or in combination therewith, a centrifugal disk or a small turbine is provided, which generates the spray jet directed towards substrate 9.

A similar embodiment of the apparatus may be selected if a substrate held on a carrier is to be treated in a chamber with other materials, for example if a si-wafer coated with a photosensitive resist after exposure through a mask is to be treated with a developer and an etching solution.

What is claimed is:

1. An apparatus for coating a substrate with a coating material, which comprises a treating chamber holding a carrier for the substrate to be coated, at least one atomizing nozzle generating a metered spray mist of the coating material suspended in a propellant gas, guiding and processing means arranged in the treating chamber between each atomizing nozzle and the carrier, said means being charged with compressed gas or compressed gas in a solvent to process the metered spray mist into a spray jet guided towards the carrier, and a separating wall insertable in the treating chamber between the carrier for the substrate and the guiding and processing means for closing off a part of the treating chamber between the carrier and the guiding and processing means.

2. The apparatus of claim 1, further comprising an outlet or auction device connected to said part of the treating chamber.

3. An apparatus for coating a substrate with a coating material, which comprises a hollow cylinder treating chamber having a bottom and holding a carrier for the substrate to be coated, the carrier forming a cover of the hollow cylinder, at least one atomizing nozzle arranged close to the bottom of the hollow cylinder and generating a metered spray mist of the coating material suspended in a propellant gas, a guiding and processing means arranged in the hollow cylinder treating chamber above the bottom and between each atomizing nozzle and the carrier, said means being charged with compressed gas or compressed gas in a solvent to process the metered spray mist into a spray jet guided towards the carrier.

4. An apparatus for coating a substrate with a coating material, which comprises a hollow cylinder treating chamber having a bottom and a removable cover, the hollow cylinder treating chamber holding a carrier for the substrate to be coated, the carrier being mounted on the removable cover, at least one atomizing nozzle arranged close to the bottom of the hollow cylinder and generating a metered spray mist of the coating material suspended in a propellant gas, a guiding and processing means arranged in the hollow cylinder treating chamber above the bottom and between each atomizing nozzle and the carrier, said means being charged with compressed gas or compressed gas in a solvent to process the metered spray mist into a spray jet guided towards the carrier.

5. An apparatus for coating a substrate with a coating material, which comprises a treating chamber holding a carrier for the substrate to be coated, the treating chamber being comprised of an upper portion, a lower position consisting of a bottom and a side wall, the lower portion being arranged telescopingly in a longitudinal direction relative to the upper portion, a cover encompassing the carrier, at least one atomizing nozzle generating a metered spray mist of the coating material suspended in a propellant gas, a guiding and processing means adjustably held in the upper portion of the treating chamber between each atomizing nozzle and the carrier, said means being charged with compressed gas or compressed gas in a solvent to process the metered spray mist into a spray jet guided towards the carrier.

* * * * *